United States Patent [19]

Behrendt

[11] 4,411,486
[45] Oct. 25, 1983

[54] FUSE HOLDER FOR A CARTRIDGE FUSE

[75] Inventor: Martin Behrendt, Hagen, Fed. Rep. of Germany

[73] Assignee: Wickmann-Werke AG, Witten-Annen, Fed. Rep. of Germany

[21] Appl. No.: 236,117

[22] Filed: Feb. 19, 1981

[30] Foreign Application Priority Data

Feb. 25, 1980 [AT] Austria .................................. 1026/80

[51] Int. Cl.³ ........................................... H01R 19/12
[52] U.S. Cl. ................................ 339/147 R; 337/198; 337/213; 339/258 R
[58] Field of Search ............ 339/147 R, 147 P, 150 F, 339/256 C, 258 F, 252 F, 253 F, 258 R; 337/194–198, 201, 213–215, 245, 228

[56] References Cited

U.S. PATENT DOCUMENTS

| | | | |
|---|---|---|---|
| 1,932,937 | 10/1933 | Okun | 337/245 |
| 2,597,262 | 5/1952 | Roger | 339/221 R |
| 2,640,184 | 5/1953 | Bauer | 339/147 P |
| 2,831,087 | 4/1958 | Sundt | 337/198 |
| 3,238,334 | 3/1966 | Lopasic et al. | 337/198 |
| 3,732,516 | 5/1973 | Peutz | 337/213 |
| 4,275,374 | 6/1981 | Chaucer | 337/197 |
| 4,329,006 | 5/1982 | Gale | 337/213 |
| 4,333,701 | 6/1982 | Schick | 339/147 R |

FOREIGN PATENT DOCUMENTS

| | | | |
|---|---|---|---|
| 1089031 | 9/1960 | Fed. Rep. of Germany | 339/258 A |
| 2315780 | 1/1977 | France | 339/217 S |

*Primary Examiner*—Neil Abrams
*Attorney, Agent, or Firm*—Robert E. Burns; Emmanuel J. Lobato; Bruce L. Adams

[57] ABSTRACT

A fuse holder for an electrical cartridge fuse (5), has an insulating housing (1") having a mounting recess (4) for the fuse (5) and a pair of contacts (2, 3) in the housing (1") for engaging respective end caps of the fuse (5). The housing (1") includes a pair of slots (6, 7) extending substantially parallel with the longitudinal axis of the mounting recess (4), the contacts (2, 3) being arranged one in each of the slots (6, 7). Each contact (2, 3) has a spring contact tongue (22', 27') which projects inwardly out of the respective slot (6, 7) to engage the associated contact cap on the fuse (5).

20 Claims, 17 Drawing Figures

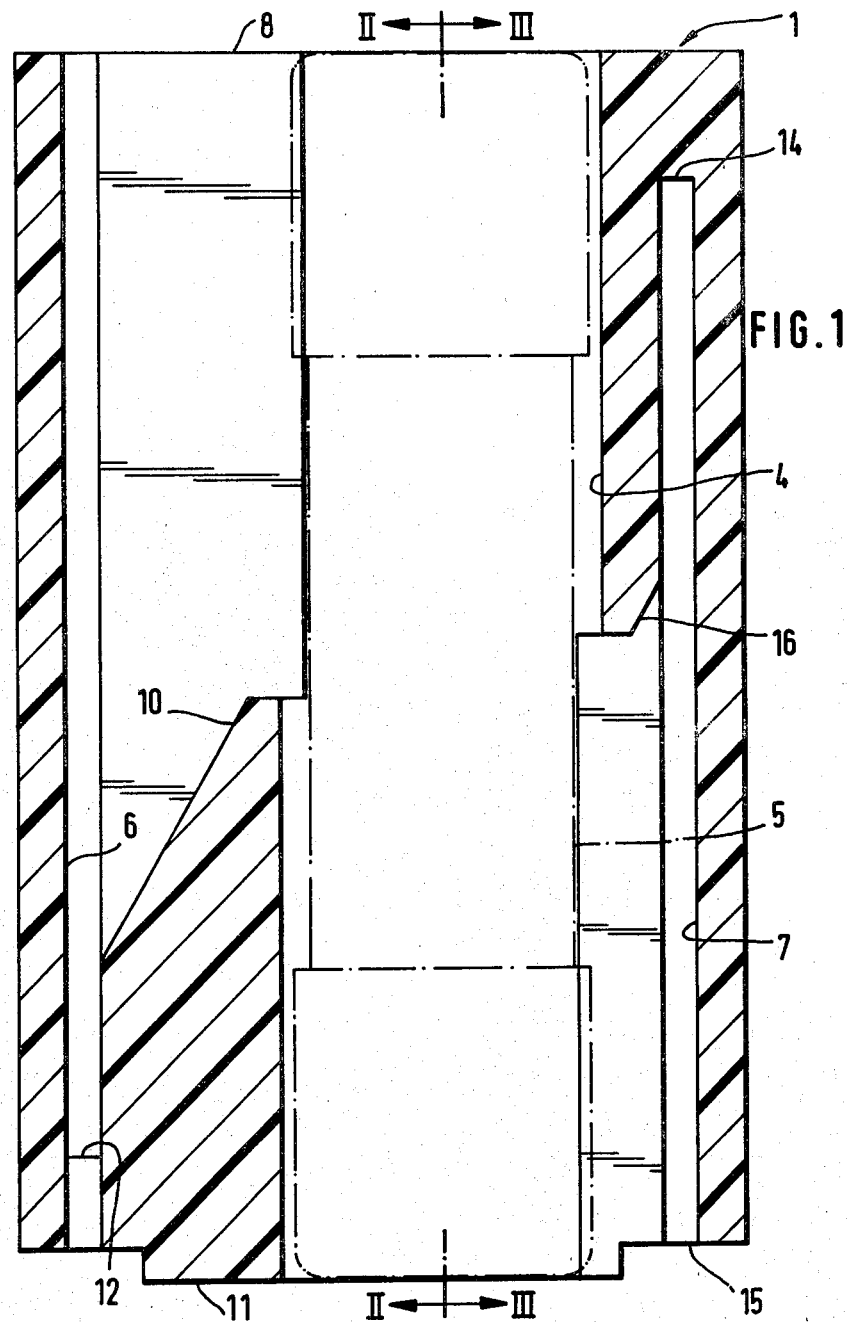

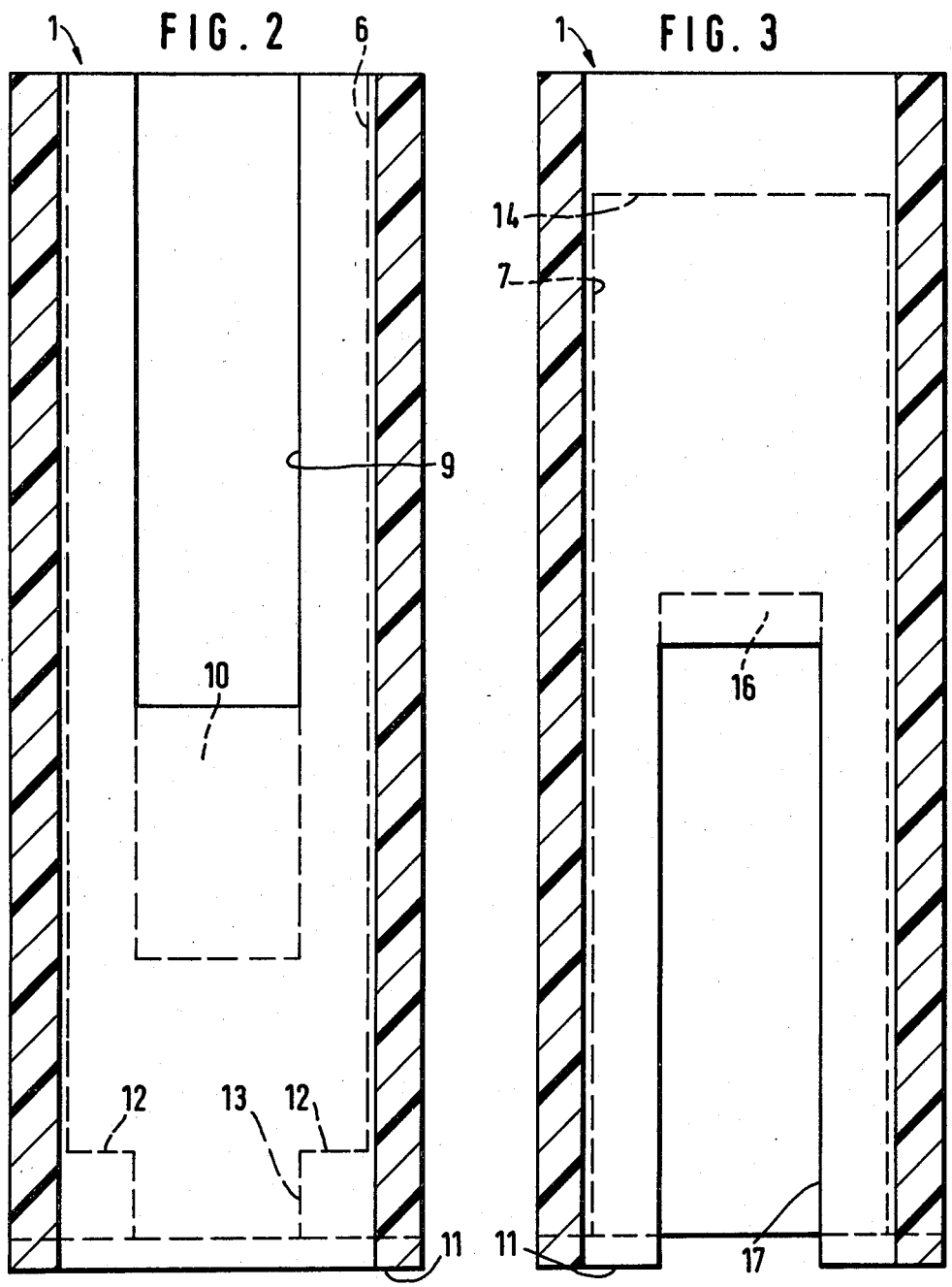

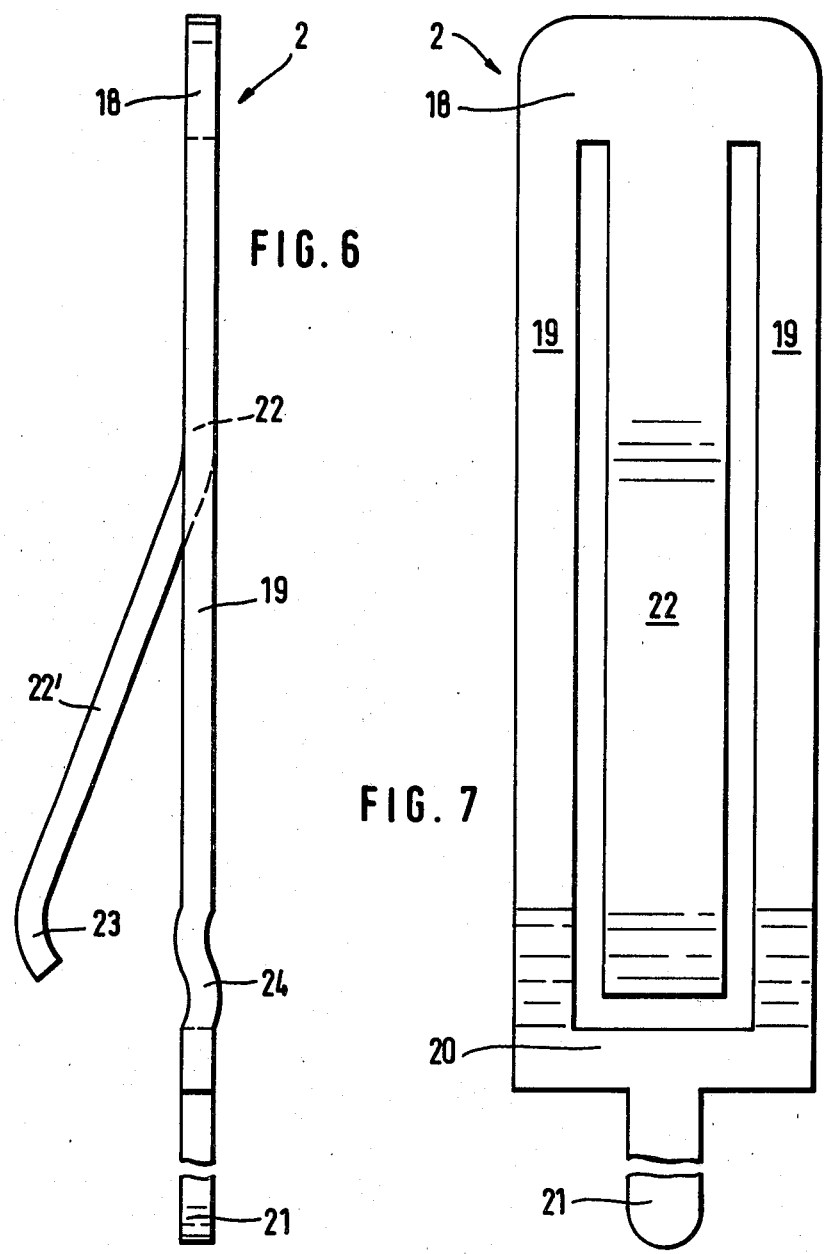

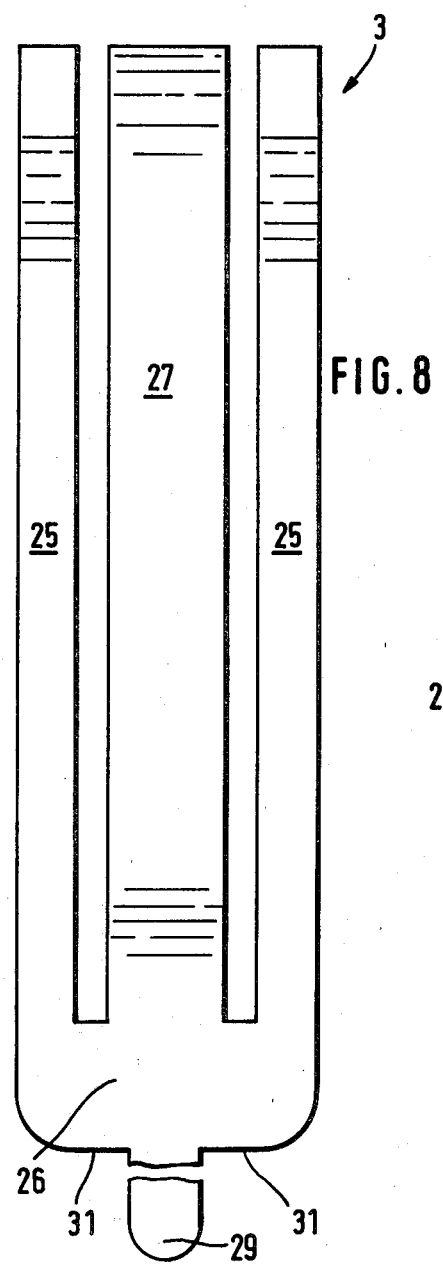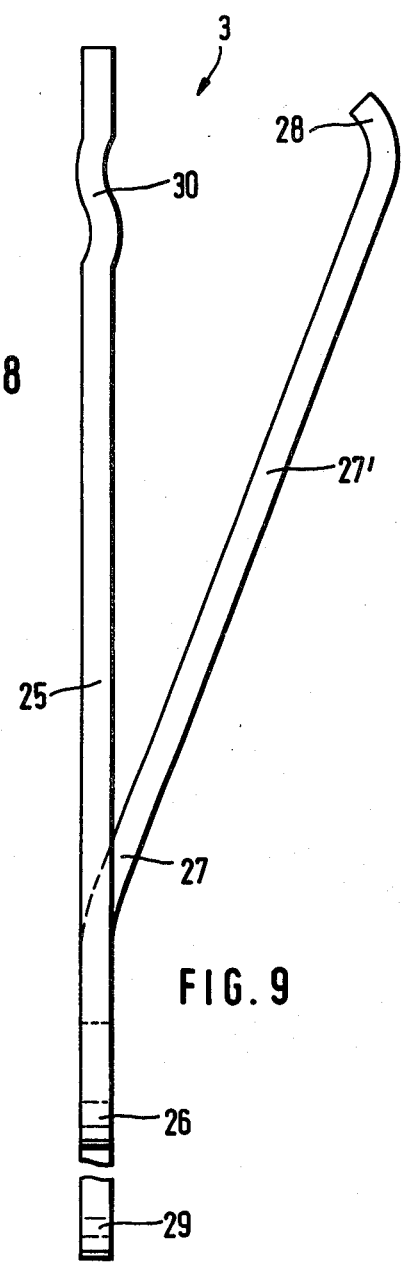

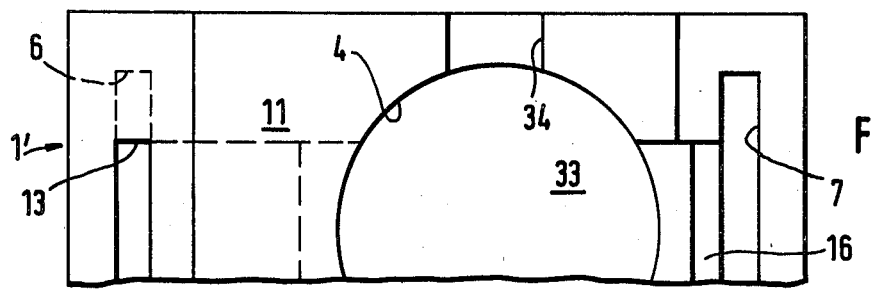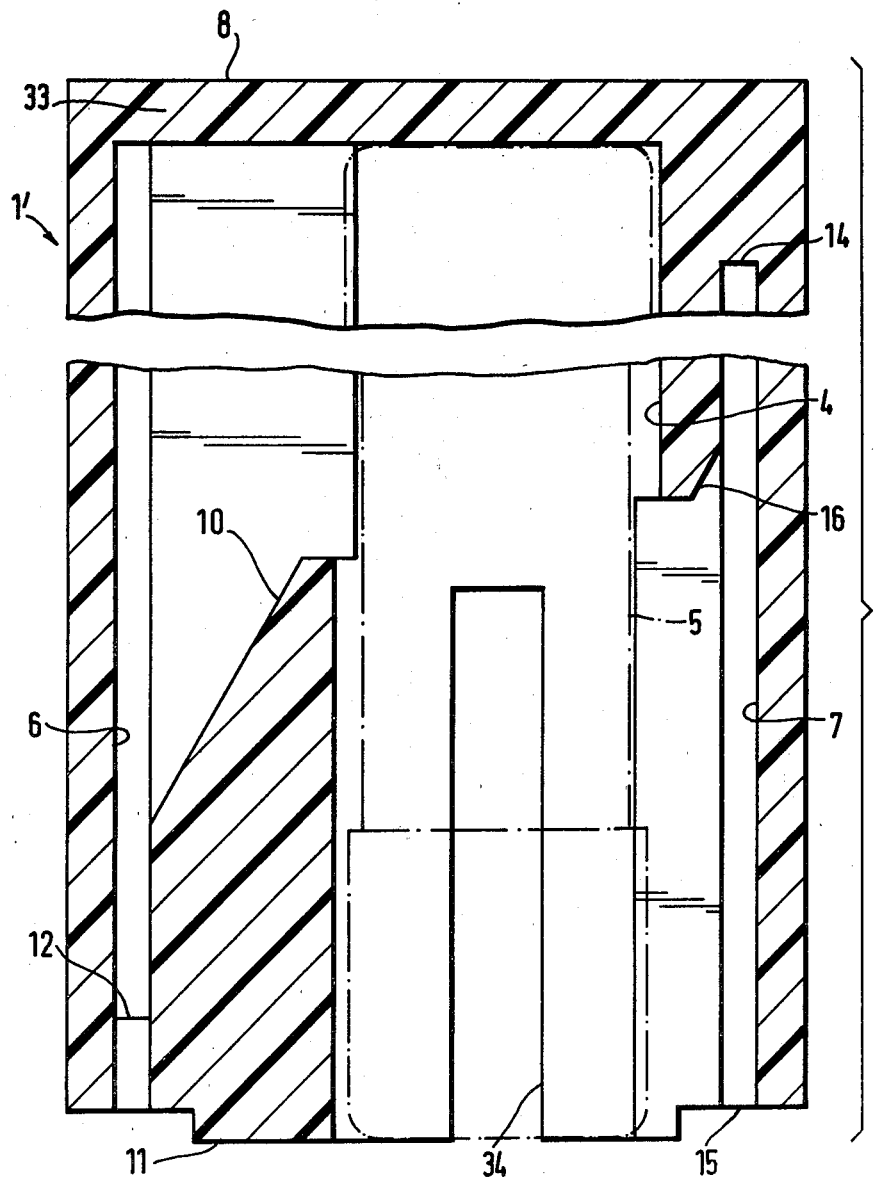

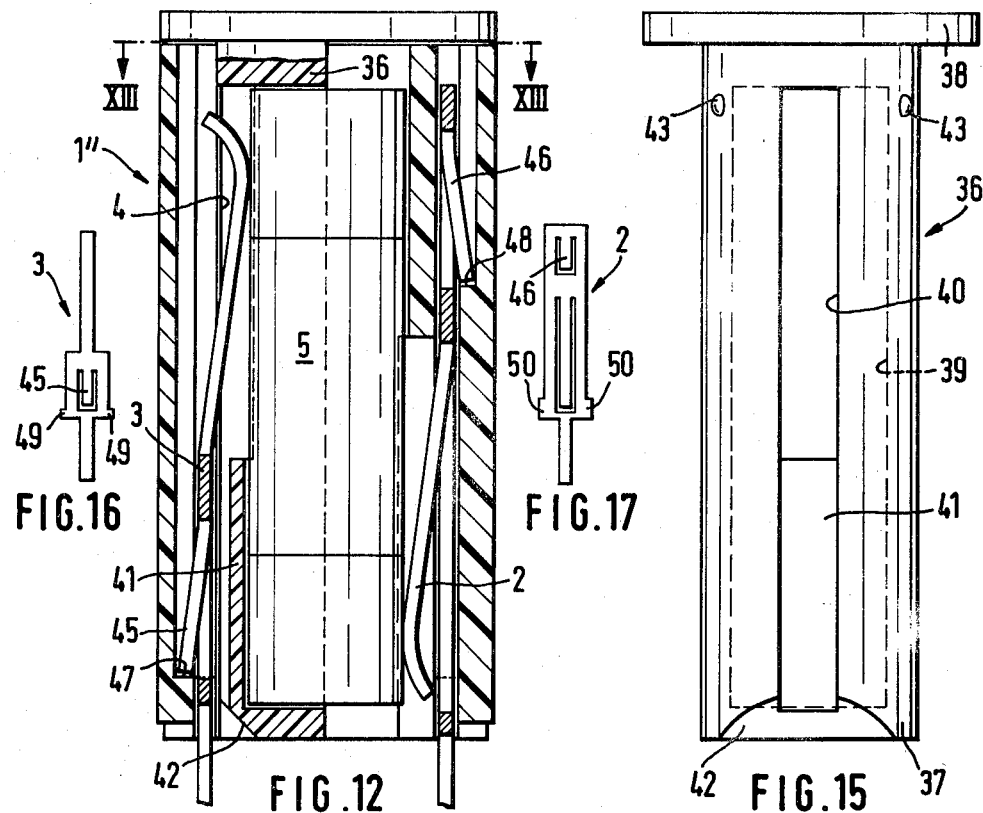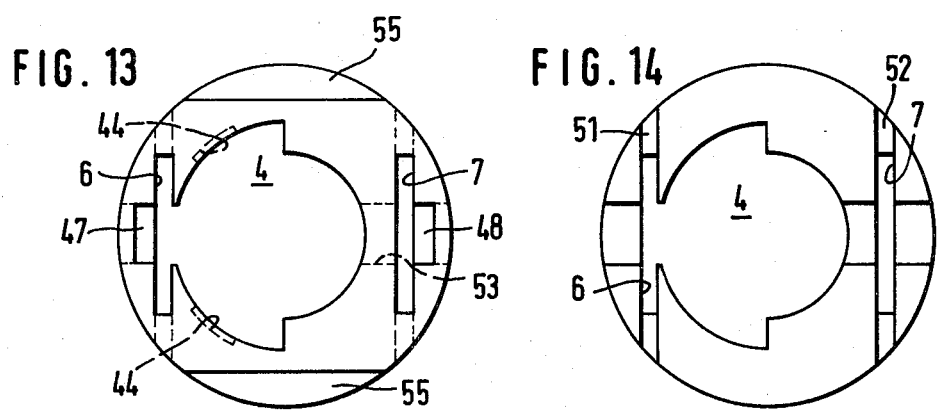

FUSE HOLDER FOR A CARTRIDGE FUSE

The invention relates to a fuse holder for an electrical cartridge fuse particularly for use on printed circuit boards, the holder consisting of a housing of insulating material having a recess for receiving the fuse cartridge and a pair of contacts (usually referred to as a foot contact and a side contact) which are arranged in the housing. For printed circuit board use, these contacts are connected to plug-in contacts projecting from the bottom part of the housing for plugging into a printed circuit board. After the insertion of a fuse cartridge into the housing, the contacts are in electrically conductive contact with one of the two caps on the fuse cartridge.

The holders of the above known kind have large length and width dimensions in proportion to the size of the fuse cartridge and in particular considering the space available on a printed circuit board for the fuse inclusive of the holder. Furthermore the construction of the known holders, especially on printed circuit boards, causes relatively high costs in manufacture, above all because a comparatively large number of individual parts have to be assembled and also have, first of all, to be partially connected together.

The object of the invention is therefore to create a fuse holder, especially for use on printed circuit boards, which is easy to produce and is as small as possible.

According to the present invention in a fuse holder for an electrical cartridge fuse, the holder comprising an insulating housing having a mounting recess for the fuse, and a pair of contacts in the housing for engaging respective end caps of the fuse, the housing includes a pair of slots extending substantially parallel with the longitudinal axis of the mounting recess, the contacts being arranged one in each of the slots and each having a spring contact tongue which projects inwardly out of the respective slot to engage the associated contact cap on the fuse.

Differing from known holders, underlying the invention is the recognition that the width and length of a holder for a cartridge fuse can be considerably reduced if the two contacts, namely the foot contact and the side contact, are made for assembly in two slots which can be accommodated, to save space, in the wall of the housing surrounding the mounting opening. The necessary electrical connection between the contacts and the contact caps on the fuse cartridge is produced by contact tongues which project inwardly from the contacts in such a way that the contact tongues engage with spring pressure against the contact caps. The contact tongue merely needs to project appropriately far inwards, so that upon insertion of a fuse cartridge it is pressed back so as to produce a permanent contact pressure between the contact tongue and the contact cap. This contact pressure acts practically in the radial direction, and in contrast to the known embodiments allows the fuse cartridge to be axially held in the cylindrical mounting recess in the housing by clamping.

From the above explanation it can be appreciated that a fuse holder in accordance with the invention can have a very small width. The structural length of the holder can also be reduced down as small as possible namely, to the actual length of the fuse cartridge, because the axial fixing of the fuse cartridge by clamping in the mounting recess avoids other structural features which are usually necessary to achieve the same purpose. Usually, springy engagement on the end faces between the two contact caps and corresponding parts of the foot contact and/or the side contact is arranged with the result that the fuse cartridge is necessarily always under axial spring pressure in the position of use.

The contacts can take many forms as will be appreciated from the description below, and can easily be manufactured and mounted. It is obvious that the insulating housing also does not cause any kind of manufacturing problems. Consequently to form the holder it is merely necessary to form the housing of insulating material (which can be produced in a simple moulding process) and two contacts consisting of e.g. sheet metal, and mount them simply in the housing.

The invention thus combines considerable advantages from the point of view of manufacturing technique with use characteristics (which heretofore could not be achieved) resulting from the miniaturization of the holder.

To exchange fuse cartridges, the holder can be unplugged from an associated printed circuit board, and by sliding in a new fuse cartridge from one end of the mounting recess, the existing fuse cartridge is forced out of the recess at the other end. Thus the construction of the invention causes no new difficulties or disadvantages as compared with the known holders even when exchanging fuses.

Although the fundamental use of the new fuse holder in accordance with the invention is with printed circuit boards, the invention can also be applied to other types of fuse holders. Thus it applies even to fuse holders which consist of a base which is to be attached to an apparatus and a head which is to be able to be mounted on it and removed from it, one of the contacts being adapted to engage the metal sleeve which is normally arranged in the head. Additional measures may be necessary in this case to ensure safety against contact in order to avoid unintentional touching of the contact itself or of other live metal parts, in particular at the time of changing fuse cartridges.

Preferably the slots in the casing are arranged diametrically opposite one another. This is advantageous for mounting the contacts as well as meeting the standardized distance between the plug-in contacts on circuit boards. If it were desired to provide the side contact and the foot contact in some way other than that previously mentioned, it would hardly be possible to make the plug-in contacts as mere prolongations of the side and foot contacts in one piece and running in one plane with them. However, theoretrically the two contacts can also be arranged one behind the other, looking in the longitudinal direction to the holder, by providing the side contact with an arm bent downwards in parallel with the foot contact but running isolated from it, the side contact opening out into its plug-in contact, if necessary after bending out at the underside of the holder to achieve the standardized distance between the plug-in contacts. It is clear that the invention can readily be modified even as regards the arrangement of the contacts in the housing.

The foot contact and the side contact are advantageously made respectively as one piece stamped sheet-metal parts which can be slid through openings in the endface of the housing into the associated slots, and from which the contact tongue, for the springy engagement with the fuse cartridge, is bent down, and which exhibits at least one arm for fastening the foot contact or side contact respectively into the slot. This construction of the foot contact and of the side contact is simple to realize. The absence of any points of connection such as soldered joints or the like guarantees a high degree of reliability in the use of the holder.

Preferably, the arm of each contact serving for fastening continues in each case in one piece into the plug-in contact. Thus no connection work is needed, which would impair the service life of contacts constructed in that way.

The side contact preferably exhibits two arms serving for fastening, extending in the shape of a fork from a connector part and arranged between them a contact tongue bent out from the connector part as well as a plug-in contact which extends from the side of the connector part remote from the contact tongue. This construction leads to a side contact which can be produced simply as well as without significant waste and which comprises in one piece the contact tongue as well as two arms serving for the fastening of the side contact in the housing and furthermore the associated plug-in contact.

The foot contact is made advantageously in a similar way, in that the foot contact has two parallel arms serving for fastening, lying opposite one another at a distance apart, extending from a connector part from which is bent out the contact tongue arranged between the arms. The arms extend as far as one side of a connector web which lies opposite the connector part at a distance corresponding with the length of the arms, and from the other side of which extends the plug-in contact. The same advantages arise for the manufacture as for the use of the contact.

For the fastening of the arms intended for the support of the contacts in the associated slots various possibilities arise, which are used either on their own or together with other kinds of fastening. As a solution which is particularly simple it is to be preferred that at least one point in the arms a corrugation is formed or a barb on a web connecting the two arms, which does not oppose the introduction of the contact in question into the slot but brings about a springy clamping or respectively a hooking of the arm of the contact into the slot so that by appropriate dimensioning unintentional withdrawal of the contact from the slot is prevented. If necessary adhesives may be used in addition, in which case at least during the assembly for the length of time which the adhesive needs in order to become effective, the position of the contact is unaltered by the clamping in the slot. Furthermore the springy engagement of the thickening corrugation with the walls of the slot lying opposite one another can also compensate for some manufacturing tolerances.

The ends of the contact tongues are advantageously curved, in order to enable the easiest possible sliding between the contact tongues and the fuse cartridge upon insertion or exchange of the latter, and above all, to prevent any danger of catching the contact tongues against projecting edges of the fuse cartridge such as the inner edges of the contact caps of the fuse cartridge. Furthermore in combination with an exact axial fixing of the contacts in the housing, the contact tongue always comes into engagement with the contact cap concerned on the fuse cartridge at an exactly predetermined point. Finally also a concentration of the pressure applied by the contact tongue against the associated contact cap is achieved, with operates favourably in particular for the electrical contact between the two parts.

The mounting recess in the housing may, in an alternative example, be closed at its top end after introduction of the side contact, by an endplate which is connected to the housing by, for example, gluing or ultrasonic welding so that any touching of metal parts of the holder is prevented when this is plugged into the printed circuit board. In order that in this case too a defective fuse cartridge may easily be removed, a slot extends from the bottom endface of the housing in the direction longitudinal to the mounting opening far enough for the edge of the bottom cap of the fuse cartridge which is to be removed, to be able to be engaged by means of a tool, for example, a screwdriver.

The contacts can be slid into the slots from the bottom end of the casing as far as a stop formed by lateral projections on the contacts which engages corresponding counterfaces on the housing and can be secured against unintentional withdrawal from the slots by means of spring tongues which catch behind shoulders inside the housing. This construction is not only simple to realize but also gives the designer more freedom and possibilities in the design of the holder in particular when the holder is also to be completely safe during exchange of the cartridge, as is explained below.

If the danger from live parts of the holder and/or of the fuse cartridge is to be guarded against at the time of exchange of the latter, the fuse cartridge can be inserted in the mounting recess in a carrier of insulating material, and for making contact between the contact caps of the fuse cartridge and the contacts the carrier has suitable openings. Preferably, the carrier is made in the form of a half shell corresponding with the cross-sectional shape of the mounting recess and having a slot of restricted length in the shell wall for the penetration of the contact tongues. The half-shell form permits simple exchange of the fuse cartridge and guarantees that the carrier with the fuse cartridge can be introduced only in a predetermined position into the mounting opening in the casing. Advantageously at the bottom of the carrier, a bottom, and at the top, a plate, which covers over the upper endface of the casing are made in one piece with the carrier, so that this covering especially in the upper region completely conceals both the slots intended for receiving the contacts and also in the case of the half-shell form of the carrier the mounting opening in the casing.

In order to achieve a fixed position of the carrier in the axial direction with respect to the housing whether or not the aforesaid cover plate is employed, the carrier may be fixed detachably to the casing by, for example, catchbuttons on the outer wall of the carrier, which come into engagement with corresponding catch-depressions in the wall of the mounting recess.

An important feature of the invention with respect to the safety of the holder against contact consists in the fact that the bottom part of the carrier facing the side contact has a portion of wall which projects beyond the bottom contact cap of the fuse. Consequently the slit facing the side contact ends at an appropriate distance from the bottom contact cap of the fuse cartridge in the end position of the latter in the housing. This feature is important in order to prevent the bottom contact cap of the fuse touching the wrong contact upon introduction of the carrier.

This wall portion preferably has a thickness less than the rest of the carrier wall in order to keep the spring travel of the side contact as small as possible upon insertion of the carrier, when the portion of wall slides along against the side contact.

At the top end of the carrier depressions are advantageously provided, in order to be able to release the carrier easily from the casing at the time of exchange of the fuse cartridge.

By fitting and construction of appropriate known means for fastening to the outer wall of the housing, the holder of the invention may be employed, for example, also as a front panel holder for fuse cartridges.

Three examples of the invention will now be described with reference to the accompanying drawings, in which:

FIG. 1 is a longitudinal section of a first holder along the longitudinal central plane;

FIG. 2 is a side section of the housing along the line II—II in FIG. 1;

FIG. 3 is a side section of the housing along the line III—III in FIG. 1;

FIG. 6 is a side elevation of a first or foot contact for this housing;

FIG. 7 is a front elevation of the same foot contact;

FIG. 8 is a front elevation of a second or side contact for the housing;

FIG. 9 is a side elevation of the side contact;

FIG. 10 is a sectional illustration, along the longitudinal central plane of a second holder;

FIG. 11 is a view of the holder housing of FIG. 10, from below;

FIG. 12 is an elevation of a third embodiment of a holder in section along the longitudinal central plane;

FIG. 13 is a plane of the housing of the holder of FIG. 12 along the line XIII—XIII, but without showing the contacts which may be seen in FIG. 12, and a carrier employed in this embodiment;

FIG. 14 is a view from below corresponding with FIGS. 12 and 13, likewise without contacts and carrier;

FIG. 15 is a side elevation of the previously mentioned carrier for a fuse cartridge, which may be employed in combination with the embodiment in accordance with FIGS. 12–14;

FIG. 16 is a plan of a side contact employed in the embodiment in accordance with FIG. 12;

FIG. 17 is a corresponding plan of a foot contact.

A fuse holder for use on printed circuit boards comprises a housing 1, 1', 1", formed of insulating material and arranged in it one foot contact 2 and one side contact 3, both of springy sheet metal as usually used for such contacts.

Figure 4:
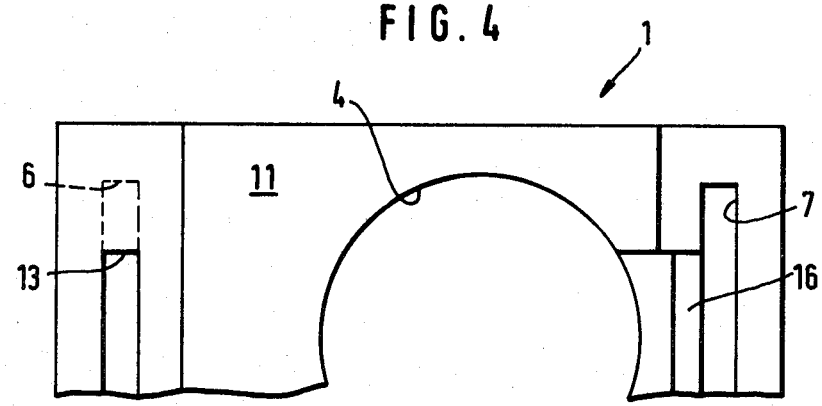
FIG. 4 is a view of the housing from below.
Figure 5:
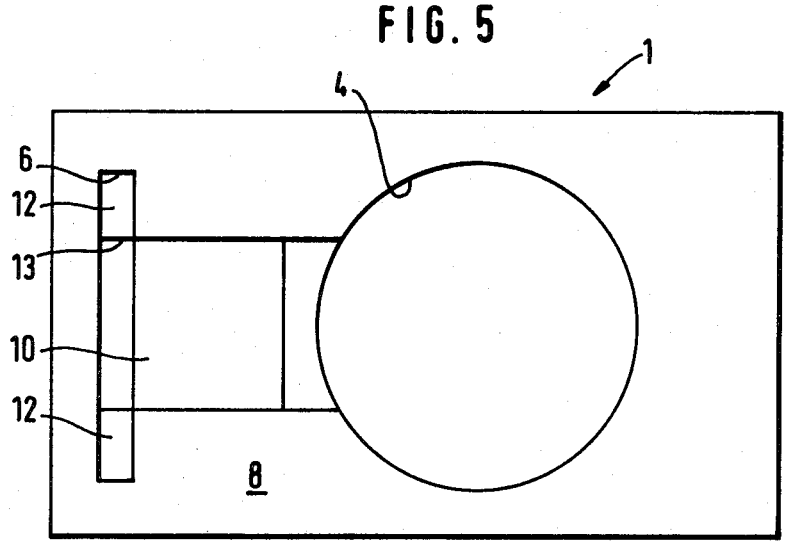
FIG. 5 is a plan view of the housing.

In the first example, the housing 1 has a mounting recess 4 for receiving a fuse cartridge 5 indicated in FIG. 1 in dash-dot lines. In parallel with the axis of the recess there runs a slot 6 in the wall of the housing for receiving the side contact 3. Lying diametrically opposite it is a corresponding slot 7 for receiving the foot contact 2; the detailed construction of the slots may be seen from the FIGS. 1–5.

The slot 6 into which the side contact 3 may be slid in a simple way from the top endface 8 of the housing 1, has a recess 9 on its side facing the mounting recess 4, and which has a bevel lead surface 10 at its bottom end. At a small distance from the bottom endface 11 of the housing 1, the slot 6 is provided with shoulders 12 so that a narrow passage 13 is formed at the bottom end of the slot 6. The other slot 7 ends is open at the lower endface 11 and extends upwards to a point 14 a small distance below the top endface 8 of the housing, the point 14 forming an axial stop for the foot contact 2 which can be slid into the slot 7 through the end opening 15. A recess 17 having an end bevel 16 forms a passage extending upwards from the bottom endface 11 and across from the slot 7 to the mounting recess 4. The bevels 10 and 16 are both inclined at an angle of about 30° with respect to the longitudinal axes of the slots 6 and 7.

The housing 1 is formed either in one piece or from two halves divided along a longitudinal central plane and connected together by, for example, gluing.

Although the drawings illustrate merely one single embodiment of many possible variants, the small dimensions of the casing as regards the length and width become clear if one realizes that the mounting recess has a diameter of 5.4 mm. The dimensions of the foot contact 2 and the side contact 3 will be appreciated from FIGS. 6 to 9 which are reproduced on the same scale as the housing.

As it clear from FIGS. 6 and 7, the foot contact 2 is formed in one piece and consists of a connector part 18, from which extend, spaced apart like a fork, arms 19 which serve for fastening the foot contact 2 in the slot 7. Connecting the other ends of the arms is a common connector web 20 from which a plug-in contact tab 21 extends downwards, the tab 21 projecting beyond the endface 11 of the housing after the foot contact 2 has been mounted in the slot 7. Between the arms 19 there is a contact tongue 22, the bottom part 22' of which is bent out obliquely out of the plane of the foot contact 2 as may be seen from the drawings and which has a curved end 23. A corrugation 24 of the arms 19 serves to fasten the foot contact in the slot 7 since the thickening resulting from the corrugation 24 causes the arms 19 to engage the walls of the slot in a resilient fashion. In addition the arms 19 may be fastened in the slot 7 by an adhesive. When the foot contact 2 is slid into the slot 7 as far as the stop at the point 14, the bent down part 22' of the contact tongue 22 lies against the bevel 16 and extends from there out into the mounting recess.

The construction and mounting of the side contact 3 as shown in FIGS. 8 and 9 is effected in a similar way as the foot contact 2. In the side contact 3 also two arms extend from a connector part 26 from which extends a contact tongue 27 lying between the arms 25 and having a part 27' which again is bent out obliquely and ends in a curved part 28, while from the side of the connector part 26 lying opposite to the contact tongue 27 a plug-in contact tab 29 extends downwards. A corrugated thickening 30 serves to provide a contact pressure against the opposed walls of the slot 6, to fix the side contact 3 in the slot 6. The bottom edge 31 of the connector part 26 abuts the shoulders 12 while the plug-in contact tab 29 extends through the constructed passage 13. The contact tongue 27 rests against the bevel 10 and projects inwards into the mounting recess 4.

After the introduction and fastening of the foot contact and the side contact 2 and 3 into the slots 7 and 6 respectively, the fuse holder is ready for use. Upon the introduction of a fuse cartridge 5 the contact tongues 22 and 27 or rather their bent parts 22' and 27' respectively are sprung radially outwards in order, in the end position of the fuse cartridge 5, to engage the respective associated contact caps of the fuse cartridge 5. By doing this the necessary electrical connection between the foot contact 2 and the side contact 3 is produced and simultaneously the fuse cartridge 5 is fixed in the mounting opening 4 since the bent out parts 22' and 27' press the contact caps against the opposite wall of the mounting recess 4 and the contact pressure thereby produced holds the fuse cartridge 5 firmly in the holder.

The second example shown in FIGS. 10 and 11 differs from the first in that the mounting recess 4 is closed at its top end after introduction of the side contact 3, by the fastening of an end-plate 33, to prevent any unintentional touching of live parts of the fuse cartridge 5 or holder.

To exchange a defective fuse cartridge 5, in the first example, after the removal of the holder from the printed circuit board the defective fuse cartridge is pushed out of the mounting recess 4 by insertion of a new fuse cartridge. Since this kind of exchange is not possible in the second example, because of the closed top endface of the housing 1, a slit 34 is provided extending upwards from the lower endface 11 of the housing 1' far enough for it to be possible for the inner edge of the bottom contact cap of the fuse cartridge 5 to be engaged by means of a tool, for example, a screwdriver, in order to push the fuse cartridge 5 out of the mounting recess 4 before insertion of a new fuse cartridge.

The arms 25 shown in FIGS. 8 and 9 may also be connected at their top ends by a connector web (not shown), appropriate shortening of the contact tongue 27 being necessary. Out of this connector web a barb may be stamped, which stands down obliquely from the connector web and hooks against the wall of the slit if a force acting upwards and in the direction longitudinal to the side contact 3 tries to pull the latter out of the slot 6. The same principle may be applied to the foot contact 2. In such cases the corrugated thickenings 30 and 24 respectively could be dispersed with.

A further example may be seen from FIGS. 12 to 17. This holder, which is safe against accidental touching of the contacts even when exchanging the fuse cartridge 5, has a carrier 36 in the form of a semi-circular sectioned cylinder having a generally semi-circular bottom 37 and a circular plate 38 which corresponds with the cross-sectional shape of the casing 1'', and which projects appropriately beyond the wall of the carrier (see FIG. 12). Opposite the rectangular opening 39 in the carrier 36 there extends in the upper part a slit 40 for the penetration of the side contact 3 and below it there is a flattened portion 41 of wall of smaller thickness than the rest of the wall of the carrier 36. Underneath the wall portion 41 the wall of the carrier has a bevelled edge 42. Both of these features facilitate the running of this part of the carrier 36 along against the side contact 3 on insertion of the carrier 36 into the holder. Catchbuttons 43 which come into engagement with depressions 44 in the wall of the mounting opening 4, to form detents for securing the position of the carrier 36 in the holder.

The side contact 3 (see FIG. 16), just like the foot contact 2 (see FIG. 17), can be introduced from the underside of the housing 1'' into the slots 6 and 7 respectively. In the end position of the contacts, tongues 45 and 46 respectively spring behind shoulders 47 and 48 respectively inside the housing. Lateral projections 49 and 50 respectively restrict the movement of sliding in by striking against groove-shaped counterfaces 51 and 52 respectively. The foot contact 2 penetrates through a slit 53 through the wall of the housing 1'' for springy contact with the associated contact cap of the fuse cartridge 5.

For the insertion of a fuse cartridge 5 in this holder, the fuse cartridge is laid into the carrier 36 outside the housing 1'' and then introduced into the mounting recess 4. The correct angular position of the carrier 36 with respect to the housing 1'' is guaranteed by the shape of the carrier 36 and the corresponding cross-sectional shape of the mounting recess 4, as can be seen from FIGS. 13 and 14. The right hand half of the mounting recess 4 corresponds, apart from a slight gap for play, approximately with the cross-section of one half of a contact cap of the fuse cartridge 5, while the other half of the mounting recess 4, which is likewise semi-circular but of a larger diameter, corresponds to the cross-sectional size of the carrier 36. By means of the bevel 42 and the reduced portion 41 of the wall, the spring arm of the side contact 3, curved at the end, may be forced into the slot 6, whence, after passing through the wall portion 41, it springs back and finally adopts the position shown in FIG. 12 against the top contact cap of the fuse cartridge 5. The arm of the foot contact 2, which is made correspondingly springy, presses against the bottom contact cap. Upon the exchange of the fuse cartridge 5, gripping depressions 55 at the top part of the carrier 56 facilitate the withdrawal of the carrier from the holder. As is made clear from the drawings, even when exchanging the fuse cartridge 5 there exists absolute protection against contact, since all the components which may be live are concealed and are thereby inaccessible.

The third example is particularly suitable, with further modification, as a front panel holder, in which case the housing 1'' is merely provided with an appropriate fastening means.

I claim:

1. A fuse holder for removably holding an elongate electrical cartridge fuse having a longitudinal axis and an end cap at each end of the longitudinal axis, said holder comprising: an insulating housing having an elongate mounting recess dimensioned to receive therein said fuse, said mounting recess having a longitudinal axis extending parallel to the longitudinal axis of the fuse when the fuse is disposed in the mounting recess, and a pair of contacts in said housing for engaging respective ones of said end caps, wherein said housing has means therein defining a pair of slots, said slots being positioned diametrically opposite one another in said housing and extending substantially parallel with said longitudinal axis of said mounting recess, and said contacts being arranged one in each of said slots, each of said contacts having an elongate spring contact tongue extending lengthwise of and projecting inwardly out of a respective slot for directly engaging a respective end cap on said fuse and having a contact tab projecting out of an end of the housing for electrical connection to other circuitry during use of the fuse holder.

2. A fuse holder according to claim 1, wherein each of said contacts comprises a one-piece stamped sheet metal part, said contact being adapted to be slid into said associated slot through an end face of said housing, each of said contacts having at least one arm for fastening said contact into said associated slot.

3. A fuse holder according to claim 2, wherein said fastening arm extends into said contact tab which comprises a plug-in contact, said plug-in contact projecting from said housing.

4. A fuse holder according to claim 2, wherein one of said contacts has two fastening arms, a plug-in contact part which comprises said contact tab and a connector part, said arms etending forklike from said connector part, said contact tongue being disposed between said arms and bent out from said connector part, and said plug-in contact part extending from the side of said connector part remote from said contact tongue.

5. A fuse holder according to claim 2, wherein one of said contacts has two fastening arms, a plug-in contact part which comprises said contact tab and a connector part, said arms lying spaced apart from one another and extending from said connector part, from which also extends, and is bent out said contact tongue lying between said arms, a connector web connecting the opposite ends of said arms and said plug-in contact extending from said connector web.

6. A fuse holder according to claim 2, wherein said arm has a corrugation formed thereon for fastening said contact into said associated slot.

7. A fuse holder according to claim 2, wherein a barb is formed on said connector part for fastening said contact into said associated slot.

8. A fuse holder according to claim 1, in which the free ends of said contact tongues are curved.

9. A fuse holder according to claim 1, wherein one of said slots has a closed end, said end determining the position of said associated contact within said slot.

10. A fuse holder according to claim 1, wherein one of said slots has a shoulder forming a stop, said stop determining the position of said associated contact in said slot, and said contact tab comprises a plug-in contact part extending past said shoulder.

11. A fuse holder according to claim 1, including an endplate, and wherein said mounting recess in said housing is closed at its top end by said endplate, said housing defining a slit extending from the bottom end of said housing towards said top end far enough for the edge of said bottom cap of the fuse to be capable of being engaged by means of a tool for removal of said fuse.

12. A fuse holder according to claim 1, wherein each of said contacts can be slid into said associated slot from a bottom end of said housing, a lateral projection on said contact engaging a corresponding counterface on said housing to determine the position of said contact in said slot, said contacts being secured against unintentional withdrawal from said slots by means of tongues which engage behind shoulders inside said housing.

13. A fuse holder according to claim 1, including a fuse carrier of insulating material which can be inserted in said mounting recess in said housing, contact between said contact caps of said fuse cartridge and said contact tongues being achieved through openings defined in the sides of said carrier.

14. A fuse holder according to claim 13, wherein said carrier comprises a half shell having a cross-sectional shape corresponding to that of said mounting recess and defining a slot of restricted length in said shell wall for enabling penetration of said contact tongues.

15. A fuse holder according to claim 13, wherein said carrier includes a bottom and a top plate, said top plate covering the upper endface of said housing when said carrier is inserted in said housing.

16. A fuse holder according to claim 13, wherein said carrier includes catches formed on the outer wall of said carrier to engage depressions in the wall of said mounting recess to retain said carrier in said housing.

17. A fuse holder according to claim 13, wherein said carrier has a bottom part having a wall portion which projects beyond the position of the bottom contact cap of said fuse.

18. A fuse holder according to claim 17, wherein said wall portion has a thickness less that the rest of said carrier wall, whereby the spring travel of the associated contact is reduced upon insertion of said carrier.

19. A fuse holder according to claim 13, wherein said carrier includes depressions at its top end for gripping for removal.

20. A fuse holder according to claim 13, wherein said carrier has a bevel extending from its bottom face to ease introduction of said carrier into said mounting recess.

* * * * *